(12) United States Patent
Zeng et al.

(10) Patent No.: US 12,008,262 B2
(45) Date of Patent: Jun. 11, 2024

(54) READ VOLTAGE CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Shih-Jia Zeng, Hsinchu (TW); Chun-Wei Tsao, Taoyuan (TW); Chih-Wei Wang, Tainan (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 17/080,854

(22) Filed: Oct. 27, 2020

(65) Prior Publication Data
US 2022/0107756 A1 Apr. 7, 2022

(30) Foreign Application Priority Data
Oct. 7, 2020 (TW) ................................ 109134729

(51) Int. Cl.
*G06F 3/06* (2006.01)
(52) U.S. Cl.
CPC .......... *G06F 3/0659* (2013.01); *G06F 3/0604* (2013.01); *G06F 3/0679* (2013.01)
(58) Field of Classification Search
CPC ..... G06F 3/0659; G06F 3/0604; G06F 3/0679
See application file for complete search history.

(56) References Cited

U.S. PATENT DOCUMENTS

| 8,111,550 | B2* | 2/2012 | Sarin | G11C 16/10 365/185.03 |
| 8,145,984 | B2* | 3/2012 | Sommer | G11C 11/56 714/797 |
| 9,715,429 | B1* | 7/2017 | Lin | G11C 16/349 |
| 2008/0092015 | A1* | 4/2008 | Brandman | G06F 11/1068 714/763 |
| 2008/0123420 | A1* | 5/2008 | Brandman | G11C 16/349 365/185.09 |
| 2008/0304317 | A1* | 12/2008 | Roohparvar | G11C 16/26 365/185.24 |
| 2019/0043590 | A1* | 2/2019 | Besinga | G11C 29/00 |

FOREIGN PATENT DOCUMENTS

| CN | 107622783 | 1/2018 |
| CN | 108428467 | 8/2018 |
| TW | I667606 | 8/2019 |

OTHER PUBLICATIONS

"Office Action of Taiwan Counterpart Application", issued on Feb. 11, 2022, p. 1-p. 5.

* cited by examiner

*Primary Examiner* — Gary W. Cygiel
(74) *Attorney, Agent, or Firm* — JCIPRNET (57) ABSTRACT

An exemplary embodiment of the invention provides a read voltage control method for a rewritable non-volatile memory module. The method includes: sending a first read command sequence which instructs a reading of a plurality of first memory cells by using a first voltage level to obtain first data; obtaining first adjustment information of a read voltage according to the first data and a channel parameter of the first memory cells, and the channel parameter reflects a channel status of the first memory cells; and adjusting a voltage level of the read voltage from the first voltage level to a second voltage level according to the first adjustment information.

18 Claims, 9 Drawing Sheets

READ VOLTAGE CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 109134729, filed on Oct. 7, 2020. The entirety of the above-mentioned patent application is hereby incorporated by reference herein and made a part of this specification.

BACKGROUND

1. Technology Field

The invention relates to a memory control technique, and more particularly, to a read voltage control method, a memory storage device and a memory control circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In a memory storage device in which one memory cell can store multiple bits, multiple preset read voltage levels are used to read data stored in memory cells belonging to different states. However, after the memory storage device is used for a period of time, as the memory cell wears out, these preset reading voltage levels may be severely shifted with respect to a threshold voltage distribution of the memory cells, and may even shift to be determined wrongly as the read voltage level for reading the adjacent state. In this case, the conventional read voltage adjustment mechanism may not be able to correctly correct the read voltage level, resulting in a shortened service life of the memory storage device.

SUMMARY

The invention provides a read voltage control method, a memory storage device and a memory control circuit unit capable of improving a correction efficiency of a read voltage.

An exemplary embodiment of the invention provides a read voltage control method for a rewritable non-volatile memory module. The rewritable non-volatile memory module includes a plurality of memory cells. The read voltage control method includes: sending a first read command sequence which instructs a reading of a plurality of first memory cells in the memory cells by using a first voltage level to obtain first data; obtaining first adjustment information of a read voltage according to the first data and a channel parameter of the first memory cells, wherein the channel parameter reflects a channel status of the first memory cells; and adjusting a voltage level of the read voltage from the first voltage level to a second voltage level according to the first adjustment information.

An exemplary embodiment of the invention further provides a memory storage device, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory control circuit unit is configured to send a first read command sequence which instructs a reading of a plurality of first memory cells in the memory cells by using a first voltage level to obtain first data. The memory control circuit unit is further configured to obtain first adjustment information of a read voltage according to the first data and a channel parameter of the first memory cells. The channel parameter reflects a channel status of the first memory cells. The memory control circuit unit is further configured to adjust a voltage level of the read voltage from the first voltage level to a second voltage level according to the first adjustment information.

An exemplary embodiment of the disclosure further provides a memory control circuit unit, which is configured to control a rewritable non-volatile memory module. The memory control circuit unit includes a host interface, a memory interface and a memory management circuit. The host interface is configured to couple to a host system. The memory interface is configured to couple to a rewritable non-volatile memory module. The rewritable non-volatile memory module includes a plurality of memory cells. The memory management circuit is coupled to the host interface and the memory interface. The memory management circuit is configured to send a first read command sequence which instructs a reading of a plurality of first memory cells in the memory cells by using a first voltage level to obtain first data. The memory management circuit is further configured to obtain first adjustment information of a read voltage according to the first data and a channel parameter of the first memory cells. The channel parameter reflects a channel status of the first memory cells. The memory management circuit is further configured to adjust a voltage level of the read voltage from the first voltage level to a second voltage level according to the first adjustment information.

Based on the above, after reading the first memory cells by using the first voltage level to obtain the first data, the first adjustment information of the read voltage can be obtained according to the first data and the first adjustment information. Then, the voltage level of the read voltage can be adjusted from the first voltage level to the second voltage level according to the first adjustment information. In this way, by simultaneously considering the read first data and the channel parameter of the first memory cells to adjust the read voltage, the correction efficiency of the read voltage can be effectively improved.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the disclosure may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 1:
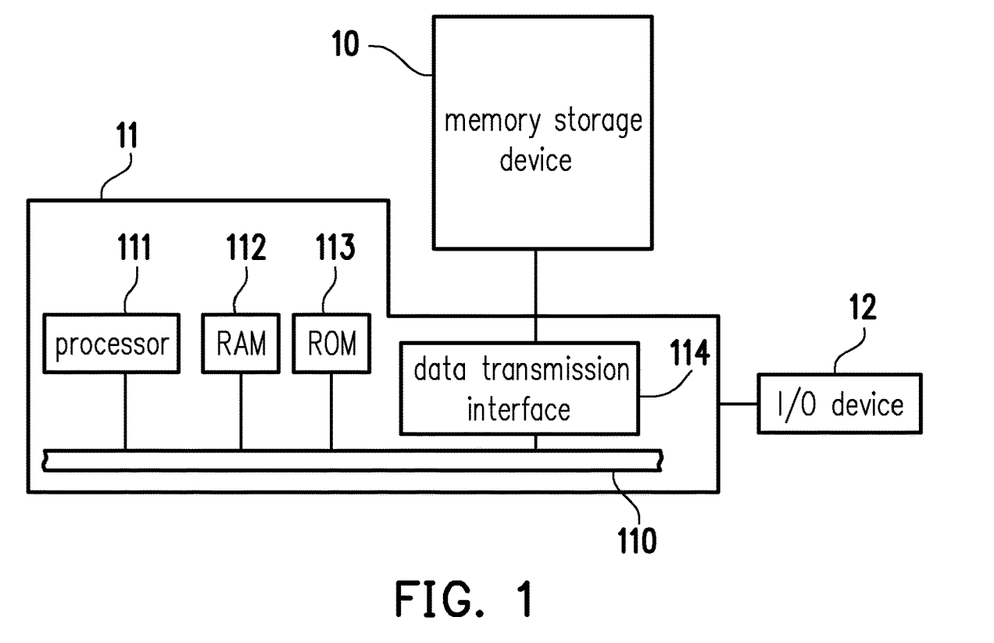
FIG. 1 is a schematic diagram illustrating a host system, a memory storage device and an I/O (input/output) device according to an exemplary embodiment of the disclosure.
Figure 2:
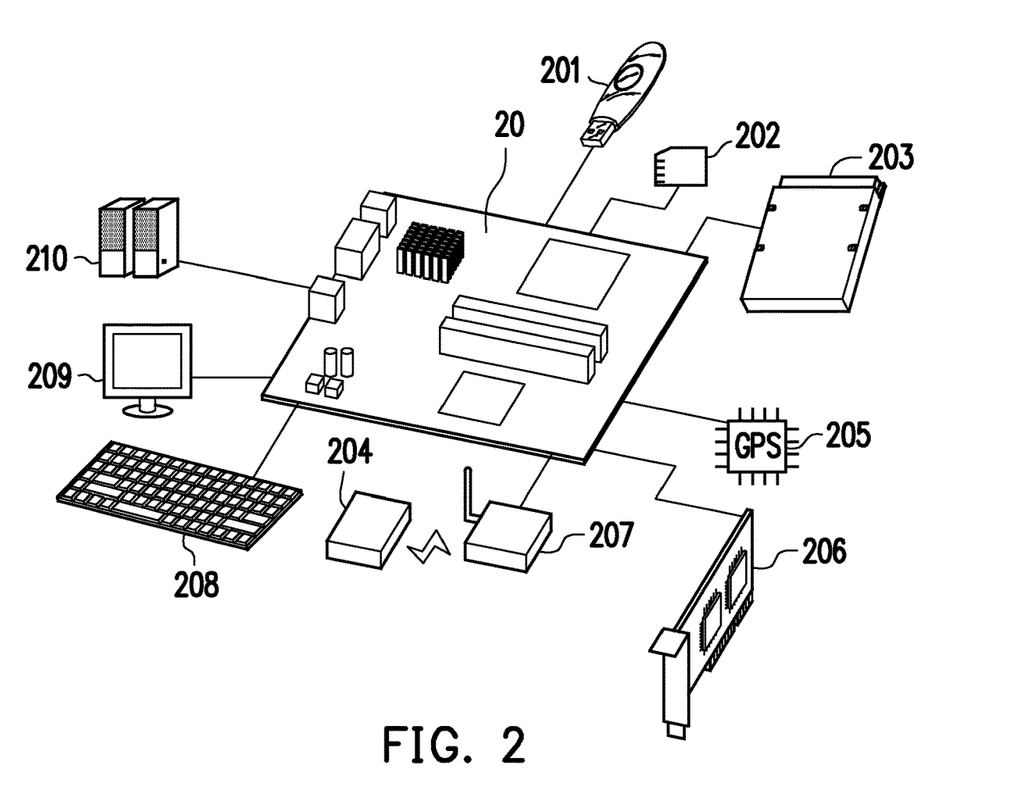
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
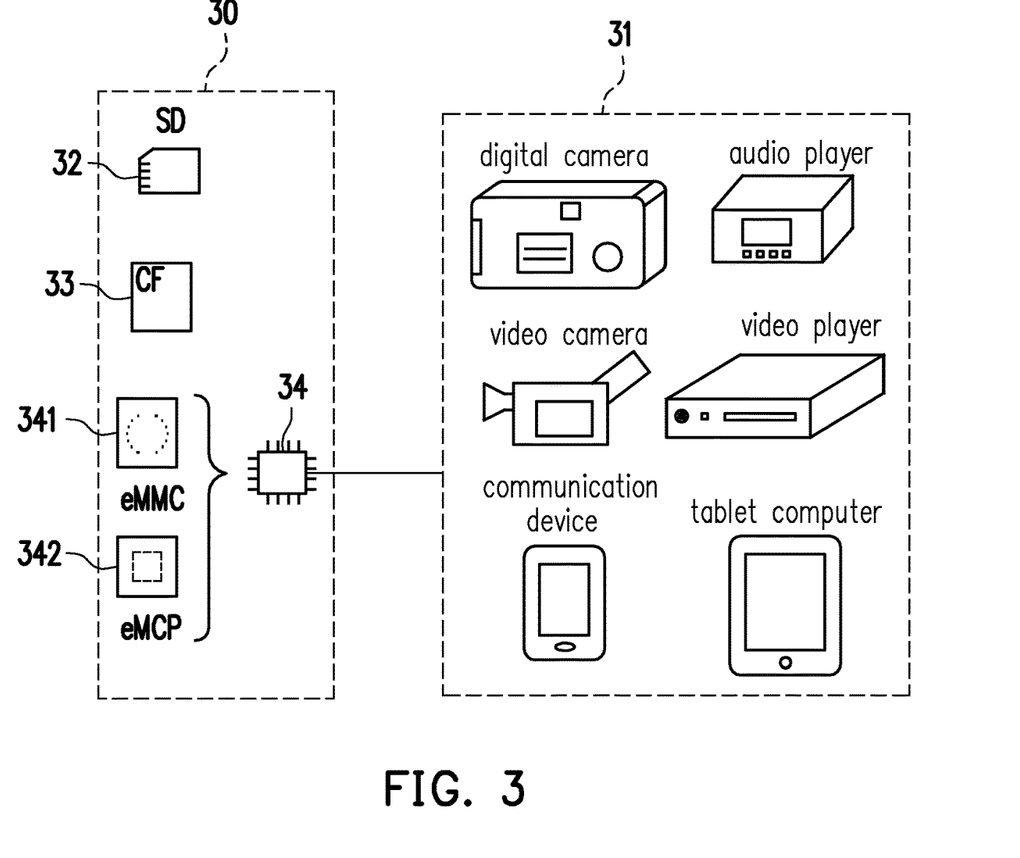
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
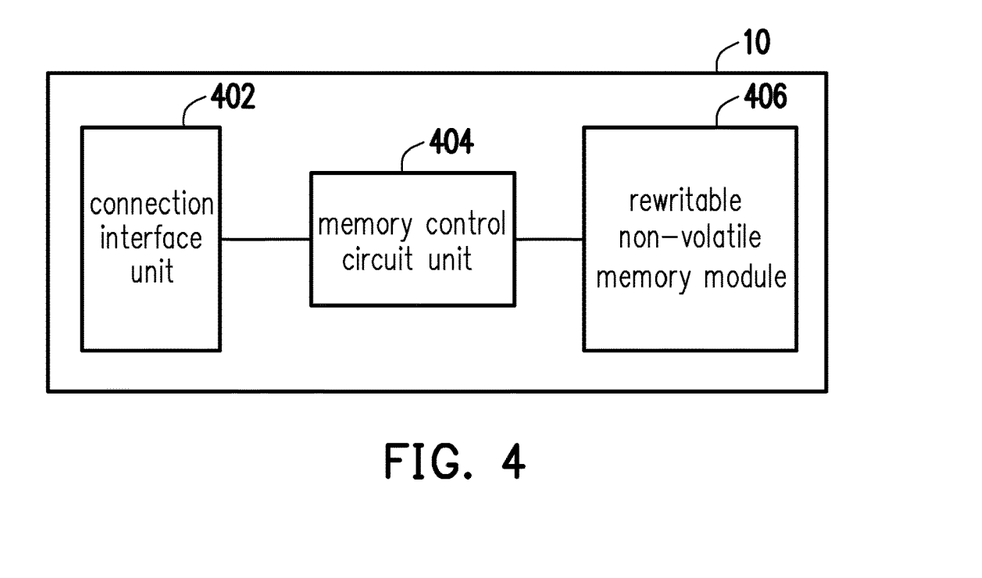
FIG. 4 is a schematic block diagram illustrating a memory storage device according to an exemplary embodiment of the invention.

FIG. 4 is a schematic block diagram illustrating a memory storage device according to an exemplary embodiment of the invention. Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. The memory storage device 10 can communicate with the host system 11 through the connection interface unit 402. In the present exemplary embodiment, the connection interface unit 402 is compatible with a SATA (Serial Advanced Technology Attachment) standard. Nevertheless, it should be understood that the disclosure is not limited in this regard. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 406 may constitute a plurality of physical programming units, and the physical programming units can constitute a plurality of physical erasing units. Specifically, the memory cells on the same word line may constitute one or more of the physical programming units. If each of the memory cells can store two or more bits, the physical programming units on the same word line may be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units may include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
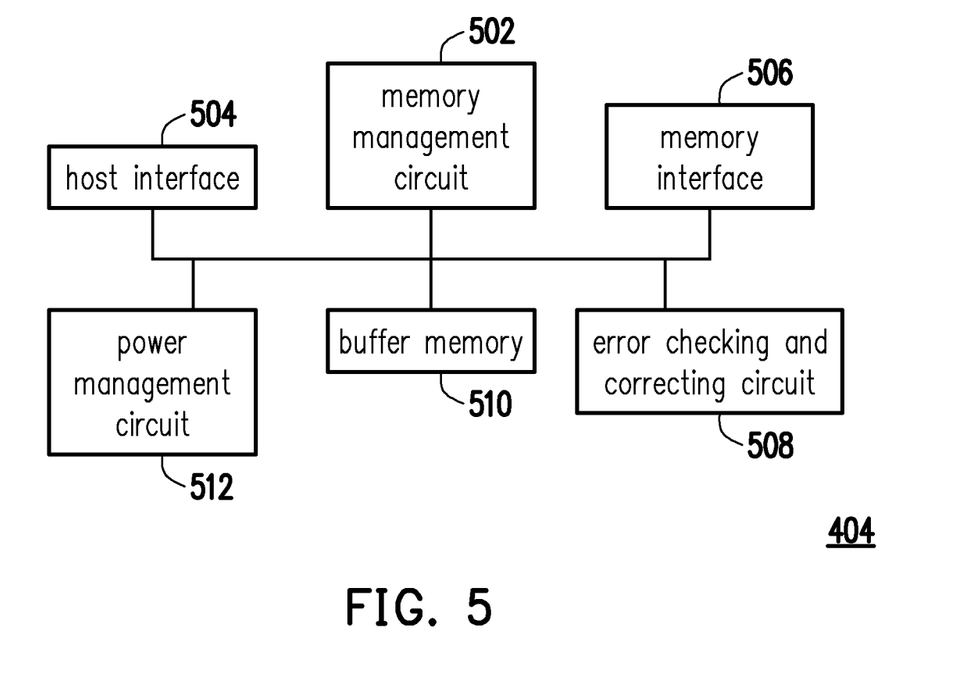
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure. Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In this exemplary embodiment, the control commands of the memory management circuit 502 are implemented in form of firmware. For instance, the memory management circuit 502 has a microprocessor unit (not illustrated) and a read-only memory (not illustrated), and the control commands are burnt into the read-only memory. When the memory storage device 10 operates, the control commands are executed by the microprocessor to execute operations of writing, reading or erasing data.

In another exemplary embodiment, the control commands of the memory management circuit 502 may also be stored as program codes in a specific area (e.g., the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to execute operations, such as writing, reading or erasing data.

Further, in another exemplary embodiment, the control commands of the memory management circuit 502 may also be implemented in form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of a memory cell group of the rewritable non-volatile memory module 406. The memory writing circuit is configured to issue a write command sequence for the rewritable non-volatile memory module 406 to write data into the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502. The memory management circuit 502 can communicate with the host system 11 through the host interface 504. The host interface 504 may be used to receive and identify commands and data transmitted by the host system 11. For example, the commands and the data transmitted by the host system 11 may be transmitted to the memory management circuit 502 via the host interface 504. In addition, the memory management circuit 502 can transmit data to the host system 11 via the host interface 504. In this exemplary embodiment, the host interface 504 is compatible with the SATA standard. Nevertheless, it should be understood that the invention is not limited in this regard. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 502 and transmitted to the rewritable non-volatile memory module 406 via the memory interface 506, for example. The command sequences may include one or more signals, or data transmitted in the bus. The signals or the data may include command codes and program codes. For example, information such as identification codes and memory addresses are included in the read command sequence.

The error checking and correcting circuit (a.k.a. a decoding circuit) 508 is coupled to the memory management circuit 502 and configured to execute an error checking and correcting operation to ensure the correctness of data. Specifically, when the memory management circuit 502 receives the writing command from the host system 11, the error checking and correcting circuit 508 generates an error correcting code (ECC) or an error detecting code (EDC) for data corresponding to the writing command, and the memory management circuit 502 writes data and the ECC or the EDC corresponding to the writing command to the rewritable non-volatile memory module 406. Then, when the memory management circuit 502 reads the data from the rewritable non-volatile memory module 406, the corresponding ECC and/or the EDC are also read, and the error checking and correcting circuit 508 executes the error checking and correcting operation on the read data based on the ECC and/or the EDC.

In an exemplary embodiment, the memory control circuit unit 404 further includes a buffer memory 510 and a power management circuit 512. The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In an exemplary embodiment, the rewritable non-volatile memory module 406 of FIG. 4 is also known as a flash memory module, and the memory control circuit unit 404 is also known as a flash memory controller for controlling the flash memory module. In an exemplary embodiment, the memory management circuit 502 of FIG. 5 is also known as a flash memory management circuit.

Figure 6:
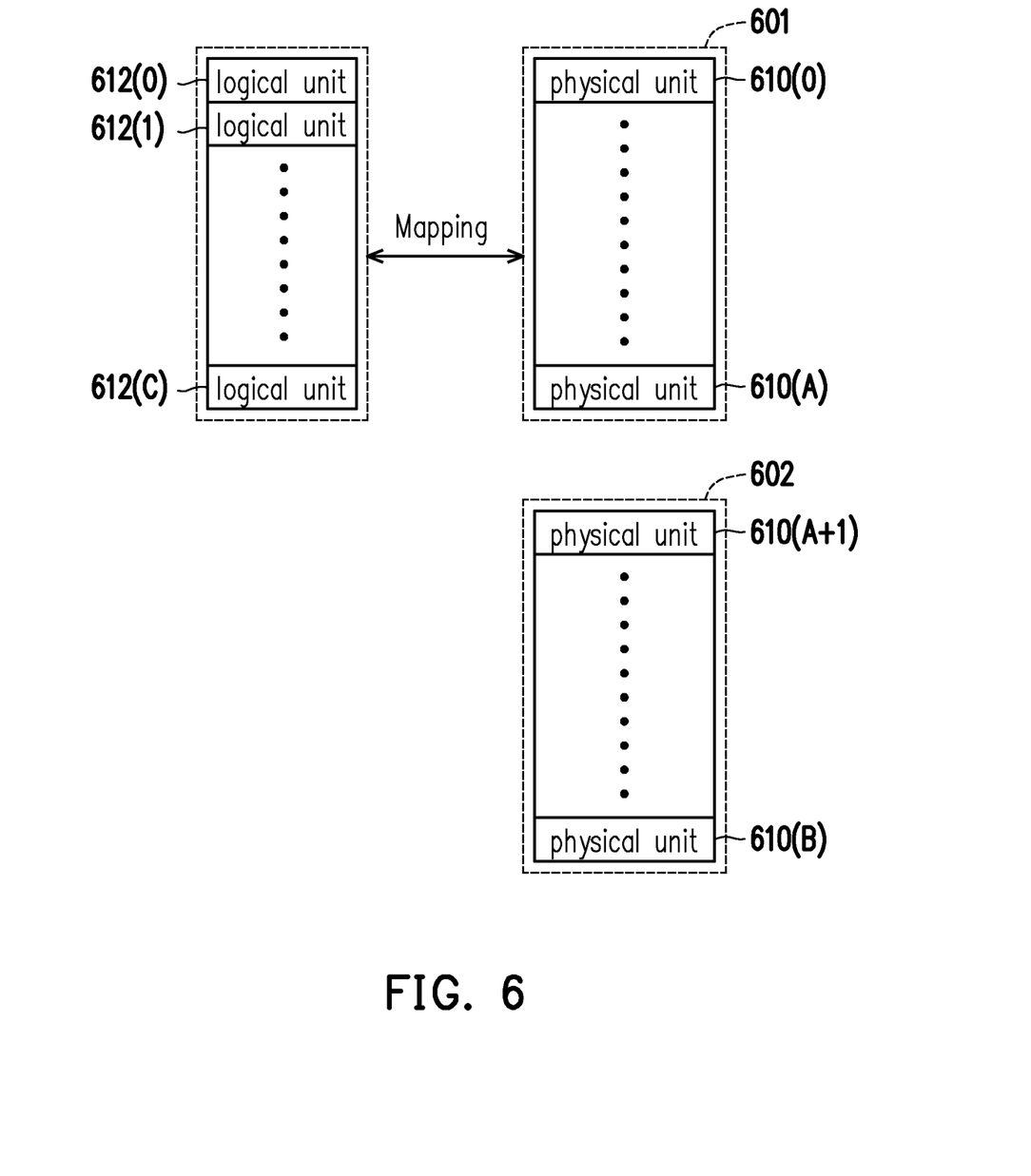
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. Referring to FIG. 6, the memory management circuit 502 can logically group physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit is regarded as a damaged physical unit. In addition, if there are no available physical erasing units in the replacement area 602, the memory management circuit 502 may declare the memory storage device 10 as in a write protect state so data can no longer be written thereto.

In the present exemplary embodiment, each physical unit refers to one physical programming unit. However, in another exemplary embodiment, one physical unit may also refer to one physical address, one physical erasing unit, or a composition of a plurality of continuous or discontinuous physical addresses. The memory management circuit 502 assigns logical units 612(0) to 612(C) for mapping to the physical units 610(0) to 610(A) in the storage area 601. In this exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

The memory management circuit 502 can record a mapping relation (a.k.a. a logical-physical address mapping relation) between the logical units and the physical units in at least one logical-physical address mapping table. When the host system 11 intends to read the data from the memory storage device 10 or write the data into the memory storage device 10, the memory management circuit 502 can perform a data accessing operation on the memory storage device 10 according to the logical-physical address mapping table.

In the following exemplary embodiments, a TLC NAND flash memory module is used as the rewritable non-volatile memory module 406 for description. However, in another exemplary embodiment, the same or similar operations can also be applied to QLC NAND type or other types of flash memory modules.

In an exemplary embodiment, the memory management circuit 502 sends a write command sequence to the rewritable non-volatile memory module 406 to instruct the rewritable non-volatile memory module 406 to program specific data into a plurality of memory cells (a.k.a. first memory cells) in the rewritable non-volatile memory module 406. For example, the specific data may be data from the host system 11 or any data. In addition, the specific data can be randomized so that total numbers of bit "0" and bit "1" in the specific data tends to be consistent. For example, the programmed first memory cell may be evenly programmed to store bits "111", "110", "100", "101", "001", "000", "010" and "011".

Figure 7:
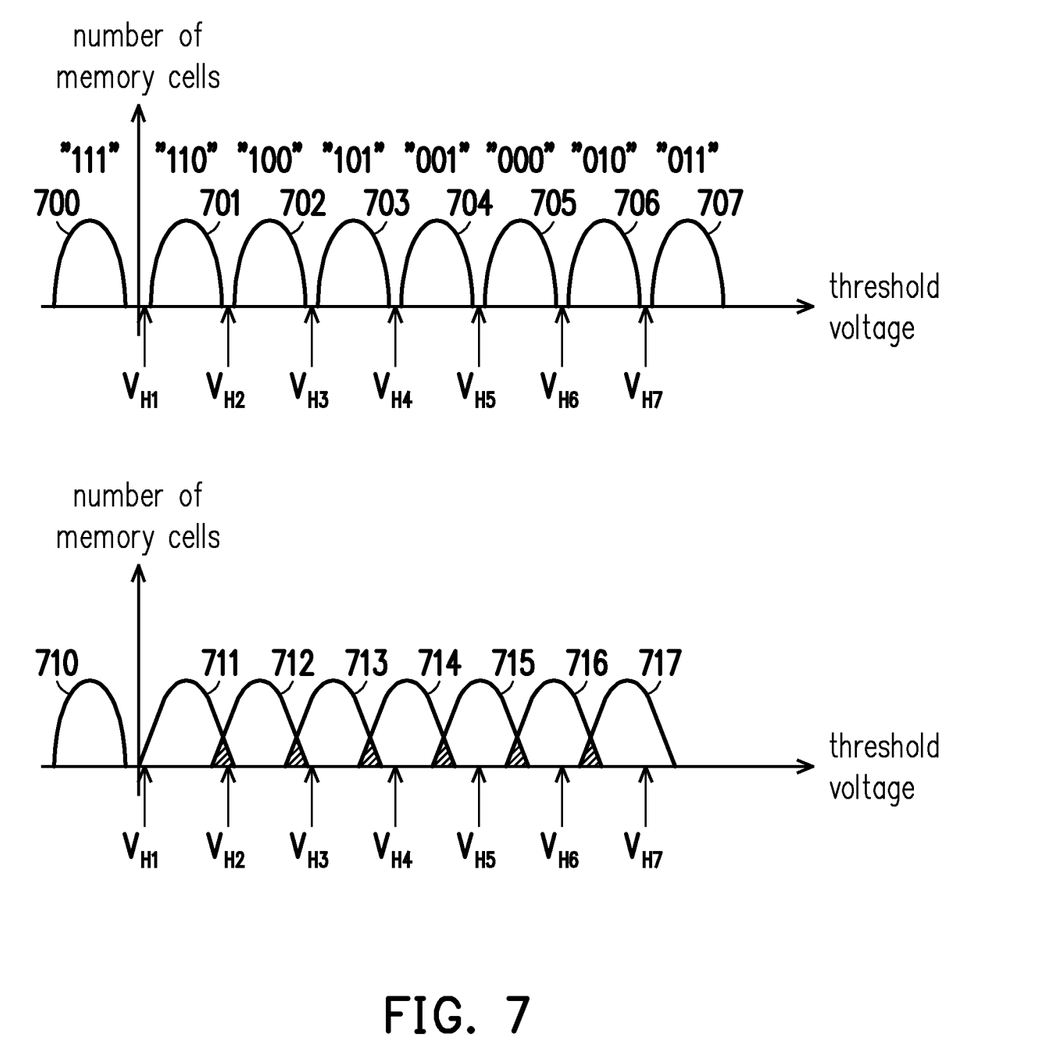
FIG. 7 is a schematic diagram illustrating threshold voltage distributions of the memory cells according to an exemplary embodiment of the invention.

FIG. 7 is a schematic diagram illustrating threshold voltage distributions of the memory cells according to an exemplary embodiment of the invention. FIG. 7 shows threshold voltage distributions of the programmed first memory cells after the specific data is programmed into the first memory cells in the rewritable non-volatile memory module 406, where a horizontal axis represents the threshold voltage of the memory cells, and a vertical axis represents the number of the memory cells.

Referring to FIG. 7, in this exemplary embodiment, the programmed first memory cells have 8 states 700 to 707. The memory cells belonging to the state 700 is used to store bit "111". The memory cells belonging to the state 701 is used to store bit "110". The memory cells belonging to the state 702 is used to store bit "100". The memory cells belonging to the state 703 is used to store bit "101". The memory cells belonging to the state 704 is used to store bit "001". The memory cells belonging to the state 705 is used to store bit "000". The memory cells belonging to the state 706 is used to store bit "010". The memory cells belonging to the state 707 is used to store bit "011". In other words, the states 700 to 707 respectively correspond to preset bit values "111", "110", "100", "101", "001", "000", "010" and "011". However, in another exemplary embodiment, the number of states 700 to 707 can be adjusted, and the corresponding preset bit value of each state can also be adjusted.

In an exemplary embodiment, read voltages having voltage levels $V_{H1}$ to $V_{H7}$ can be applied to the first memory cells to read the data stored by at least part of the first memory cells. In other words, by sequentially applying the read voltages having the voltage levels $V_{H1}$ to $V_{H7}$ to the first memory cells, one specific memory cell in the first memory cells can be determined as belonging to one of the states 700 to 707, and then the data stored in this specific memory cell can be obtained. For example, after sequentially applying the read voltages having the voltage levels $V_{H1}$ to $V_{H7}$ to the first memory cells, if one specific memory cell can be turned on by the voltage level $V_{H5}$ but cannot be turned on by the voltage level $V_{H4}$, it means that the threshold voltage of this specific memory cell is between the voltage levels $V_{H4}$ and $V_{H5}$. Therefore, it can be determined that this specific memory cell belongs to the state 704 and is used to store bit "001".

However, with increases in the usage time and/or changes in an operation environment of the first memory cells, a performance degradation may occur on the first memory cells. After the performance degradation occurs, the states 700 to 707 may gradually move close to each other or even overlap with each other. In addition, the states 700 to 707 may also become flatter. For example, the states 710 to 717 can be used to represent the threshold voltage distributions of the first memory cells after the performance degradation.

After the performance degradation, the voltage levels $V_{H1}$ to $V_{H7}$ are severely shifted with respect to the states 710 to 717 (or the states 710 to 717 are severely shifted with respect to the voltage levels $V_{H1}$ to $V_{H7}$), as shown in FIG. 7. If the uncorrected voltage levels $V_{H1}$ to $V_{H7}$ are continuously used to read the first memory cells, the states of many memory cells will be determined wrongly, which will result in many errors in the data read from the first memory cells. If the read data contains too many errors, the data may not be successfully decoded and output.

In addition, since the first memory cell has a large number of states, each state is very close to each other and occupies a narrow voltage range. Consequently, the difficulty of correcting the read voltage may increase. In some cases, after a read voltage correction is performed, it is also possible that the corrected read voltage is even farther away from the correct voltage level. Taking the voltage level $V_{H6}$ of FIG. 7 as an example, after the performance degradation of the memory cell occurs, the voltage level $V_{H6}$ shifts from a voltage position originally located between the states 705 and 706 to be closer to the state 717. Therefore, if a general read voltage correction mechanism is used, the voltage level $V_{H6}$ may be mistakenly corrected to a voltage position between the states 716 and 717, making the corrected voltage level $V_{H6}$ farther away from the correct voltage position (i.e., a voltage position between the states 715 and 716).

In an exemplary embodiment, after programming the specific data into the first memory cells, the memory management circuit 502 can send a read command sequence (a.k.a. a first read command sequence) to the rewritable non-volatile memory module 406 to instruct the rewritable non-volatile memory module 406 to read the first memory cells by using a read voltage having one specific voltage level (a.k.a. a first voltage level) to obtain data (a.k.a. first data). It should be noted that, the first data can reflect a total number of at least one memory cell that can be turned on by the first voltage level in the first memory cells. The at least one memory cell that can be turned on by the first voltage level may refer to any memory cell in the first memory cell having the threshold voltage less than the first voltage level.

Figure 8:
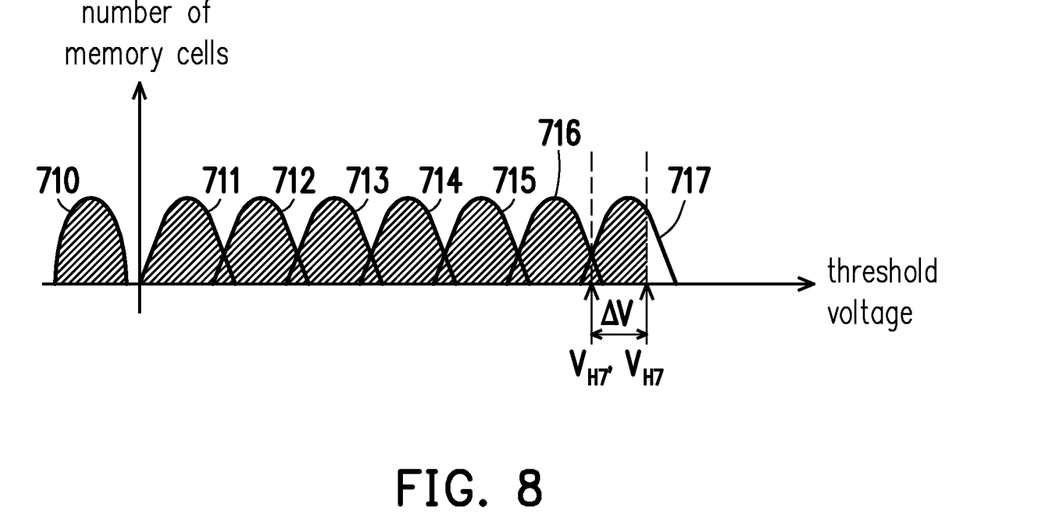
FIG. 8 is a schematic diagram for correcting a read voltage according to an exemplary embodiment of the invention.

FIG. 8 is a schematic diagram for correcting a read voltage according to an exemplary embodiment of the invention. Referring to FIG. 8, it is assumed that the first voltage level is the voltage level $V_{H7}$. After the first read command sequence is sent to instruct a reading of the first memory cells by using the read voltage having the voltage level $V_{H7}$, the first data corresponding to the voltage level $V_{H7}$ can be obtained. For example, the first data corresponding to the voltage level $V_{H7}$ can reflect a total number of at least one memory cell having the threshold voltage not greater than the voltage level $V_{H7}$ in the programmed first memory cells. Taking FIG. 8 as an example, the first data corresponding to the voltage level $V_{H7}$ can reflect the total number of memory cells covered by the area marked with oblique lines. For example, assuming that 1000 memory cells can be turned on by the voltage level $V_{H7}$, the first data can reflect the value 1000.

In an exemplary embodiment, the voltage level $V_{H7}$ can be corrected according to the first data and a channel parameter of the first memory cells. The channel parameter can reflect a channel status of the first memory cells. For example, the channel status of the first memory cells can include a threshold voltage distribution status of the first memory cells. For example, the threshold voltage distribution status of the first memory cell can reflect information related to the threshold voltage distributions of the first memory cells, such as a curve endpoint, a curve type, a curve peak value and/or a curve slope of the threshold voltage distributions of the first memory cells. After going through at least one correction, the voltage level $V_{H7}$ can be adjusted to a voltage level $V_{H7'}$. There may be a voltage difference $\Delta V$ between the voltage levels $V_{H7}$ and $V_{H7'}$. Compared with the voltage level $V_{H7}$, the new voltage level $V_{H7'}$ is closer to the voltage position between the states 716 and 717. Therefore, compared with the voltage level $V_{H7}$, by using the new voltage level $V_{H7'}$ to read the data from the first memory cells, the number of error bits in the read data may be effectively reduced.

In an exemplary embodiment, the memory management circuit 502 can obtain adjustment information (a.k.a. first adjustment information) of the read voltage according to the first data and the channel parameter of the first memory cells. The memory management circuit 502 can adjust the voltage level of the read voltage from the first voltage level to another voltage level (a.k.a. a second voltage level) according to the first adjustment information. For example, the first adjustment information can correspond to one voltage adjustment value. The memory management circuit 502 can subtract or add the voltage adjustment value from/to the first voltage level to obtain the second voltage level.

In an exemplary embodiment, the memory management circuit 502 can obtain the adjustment information of the read voltage according to the following equations (1.1) and (1.2).

$$\Delta V(i) = \Delta C(i)/D \quad (1.1)$$

$$D = (\Delta C(i)/a) + b \quad (1.2)$$

In the equations (1.1) and (1.2), $\Delta V(i)$ corresponds to the voltage adjustment value corresponding to the first adjustment information; $\Delta C(i)$ corresponds to the total number of the memory cells that can be turned on by the first voltage level in the first memory cells reflected by the first data; a and b correspond to the channel parameter of the first memory cells. In an exemplary embodiment, the memory management circuit 502 can subtract or add $\Delta V(i)$ from/to the first voltage level to obtain the second voltage level.

Figure 9:
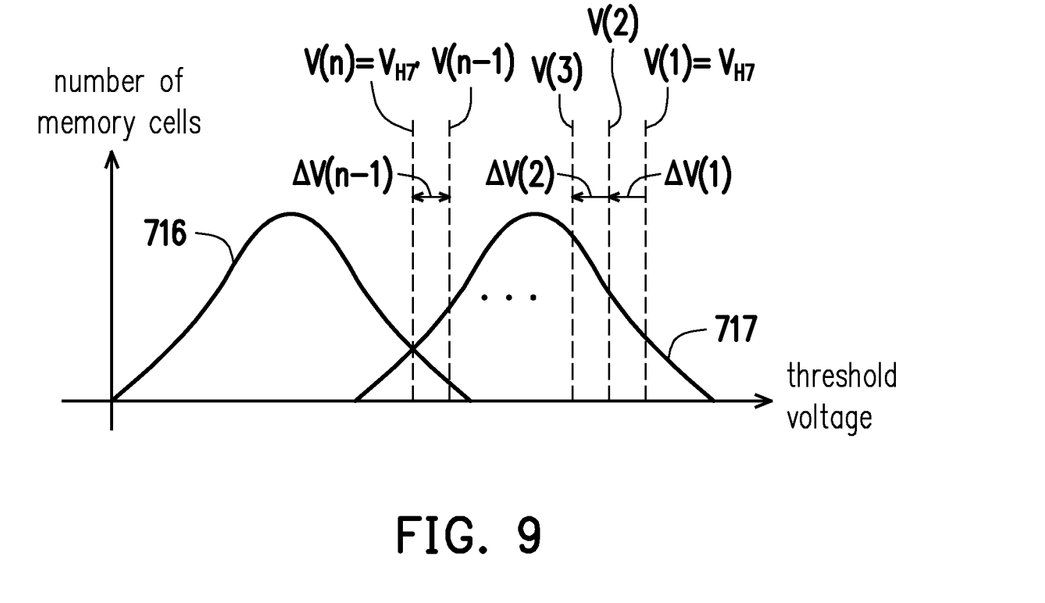
FIG. 9 is a schematic diagram for correcting a read voltage according to an exemplary embodiment of the invention.

FIG. 9 is a schematic diagram for correcting a read voltage according to an exemplary embodiment of the invention, Referring to FIG. 9, assuming that the voltage level $V_{H7'}$ can be obtained by performing correction or adjustment n−1 times on the voltage level $V_{H7}$, i in the equations (1.1) and (1.2) can be any value from 1 to n−1. For example, the voltage level V(i) can be regarded as the first voltage level, and the voltage level V(i+1) can be regarded as the second voltage level.

In an exemplary embodiment, if a=10, b=90, V(1)=30, and $\Delta C(1)$=8256, according to the equations (1.1) and (1.2), $\Delta V(1)$ can be obtained as −9. Therefore, V(2) can be determined as 21 according to V(1) and $\Delta V(1)$ (i.e., 30−9=21). By analogy, after reading and performing voltage adjustment n−1 times, a final voltage level V(n) (i.e., $V_{H7'}$) can be obtained. The voltage level V(n) may be equal to or close to an optimal read voltage level corresponding to the current threshold voltage distribution (or the channel status) of the first memory cells.

In an exemplary embodiment, the memory management circuit 502 can determine the channel parameter according to the channel status of the first memory cells. For example, if the channel status of the first memory cells matches a specific status (a.k.a. the first status), the memory management circuit 502 can determine the channel parameter as a specific parameter (a.k.a. a first parameter). Alternatively, if the channel status of the first memory cells matches another status (a.k.a. a second status), the memory management circuit 502 can determine the channel status as another parameter (a.k.a. a second parameter). The first parameter is different from the second parameter. In an exemplary embodiment, the memory management circuit 502 can determine the channel status according to the information related to the threshold voltage distributions of the first memory cells, such as the curve endpoint, the curve type, the curve peak value and/or the curve slope of the threshold voltage distributions of the first memory cells. In this way, the voltage level of the read voltage can be corrected and adjusted more accurately according to the channel parameter.

Figure 10:
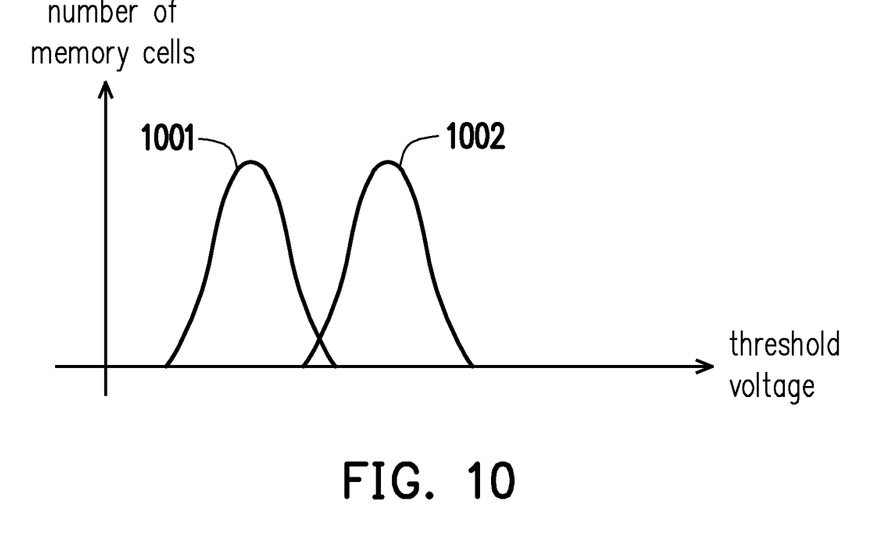
FIG. 10 and FIG. 11 are schematic diagrams illustrating threshold voltage distributions of first memory cells according to an exemplary embodiment of the invention.
Figure 11:
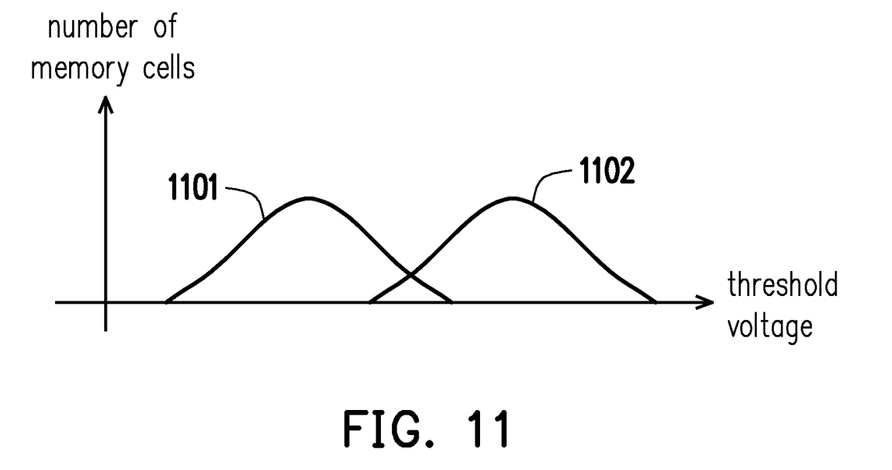

FIG. 10 and FIG. 11 are schematic diagrams illustrating threshold voltage distributions of first memory cells according to an exemplary embodiment of the invention. Referring to FIG. 10 and FIG. 11, the slope of the curve of a state 1001 and/or a state 1002 in FIG. 10 is obviously different from the slope of the curve of the state 1101 and/or the state 1102 in FIG. 11. Therefore, the channel parameter determined corresponding to the threshold voltage distributions (or the channel status) of the first memory cells of FIG. 10 may be different from the channel parameter determined corresponding to the threshold voltage distributions (or the channel status) of the first memory cells of FIG. 11. For example, it is assumed that the slope of the curve of the state 1001 and/or the state 1002 in FIG. 10 is greater than the slope of the curve of the state 1101 and/or the state 1102 in FIG. 11. Accordingly, for the threshold voltage distributions of the first memory cells in FIG. 10, a and b in the equation (1.2) can be determined as a(1) and b(1). On other hand, for the threshold voltage distributions of the first memory cells in FIG. 11, a and b in the equation (1.2) can be determined as a(2) and b(2). a(2) can be greater than a(1), and/or b(2) can be greater than b(1). For example, a(1) and b(1) can be 33 and 50, respectively, and a(2) and b(2) can be 55 and 75, respectively. It should be noted that the channel parameter can also be set to other values according to practical requirements, and the invention is not limited thereto.

In an exemplary embodiment, the memory management circuit 502 can further adjust the adjustment information of the read voltage according to a proportional parameter. For example, the proportional parameter can be input to the equation (1.1) above to generate the following equation (1.3).

$$\Delta V(i) = (\Delta C(i)/D) \times F(i) \qquad (1.3)$$

In the equation (1.3), F(i) represents the proportional parameter used when the voltage is adjusted for the i-th time. The proportional parameter can be used to increase or decrease an adjustment range of the voltage levels of the read voltage. For example, when F(i) is greater than 1, $\Delta V(i)$ will be magnified. When F(i) is between 0 and 1, $\Delta V(i)$ will be reduced.

In an exemplary embodiment, the memory management circuit 502 can further update the proportional parameter dynamically. In an exemplary embodiment, the memory management circuit 502 can send another read command sequence (a.k.a. a second read command sequence) to the rewritable non-volatile memory module 406. The second read command sequence can instruct the rewritable non-volatile memory module 406 to read the first memory cells by using the second voltage level to obtain another data (a.k.a. second data). The second data can reflect a total number of at least one memory cell that can be turned on by the second voltage level in the first memory cells. The memory management circuit 502 can adjust the proportional parameter according to the first data and the second data.

Taking FIG. 9 as an example, it is assumed that the voltage level V(i−1) is the first voltage level, and the voltage level V(i) is the second voltage level. The memory management circuit 502 can update the proportional parameter according to the first data obtained by reading the first memory cells by using the voltage level V(i−1) and the second data obtained by reading the first memory cells by using the voltage level V(i). The memory management circuit 502 can obtain $\Delta V(i)$ according to the updated proportional parameter (i.e., a new proportional parameter).

In an exemplary embodiment, the memory management circuit 502 can update the proportional parameter according to the following equations (1.4) to (1.6).

$$F(i) = F(i-1) \times \Delta F(i) \qquad (1.4)$$

$$\Delta F(i) = (1 + AF(i)) \qquad (1.5)$$

$$AF(i) = \Delta C(i)/\Delta C(i-1) \qquad (1.6)$$

In the equations (1.4) to (1.6), F(i−1) corresponds to a previously used proportional parameter, and $\Delta F(i)$ and $\Delta F(i)$ both correspond to an adjustment value of the proportional parameter. The new F(i) can be obtained according to the equations (1.4) to (1.6). For example, if $\Delta C(i)$ is 4509 and $\Delta C(i-1)$ is 8256, $\Delta F(i)$ can be 0.54 (4509/8256=0.54); $\Delta F(i)$ can be 1.54 (1+0.54=1.54); and F(i) can be magnified 1.54 times. According to the magnified proportional parameter, the adjustment range of the read voltage can be increased. In some cases (e.g., when the voltage difference $\Delta V$ in FIG. 8 is larger), the increased adjustment range of the read voltage can reduce the number of read voltage adjustments and accelerate the adjustment of the read voltage to the correct voltage level (e.g., the voltage level $V_{H7}$ of FIG. 8).

It should be noted that in another exemplary embodiment, if F(i) is less than F(i−1), it means that the adjustment range of the read voltage is reduced this time. In some cases, the reduced adjustment range of the read voltage may increase the number of adjustments of the read voltage, but it can improve an adjustment precision of the read voltage. In an exemplary embodiment, after the voltage adjustment is performed at least once, the proportional parameter may be gradually reduced to gradually improve the adjustment precision of the read voltage.

In an exemplary embodiment of FIG. 9, it is assumed that the voltage level V(i) is the first voltage level; the voltage level V(i+1) is the second voltage level; and a voltage level V(j) is a third voltage level. j can be any positive integer from i+2 to n. The memory management circuit 502 can adjust the proportional parameter according to the first voltage level, the third voltage level, and the first adjustment information for adjusting the first voltage level. For example, the memory management circuit 502 can obtain a difference between the first voltage level and the third voltage level. The memory management circuit 502 can adjust the proportional parameter according to the difference and the first adjustment information.

In an exemplary embodiment of FIG. 9, it is assumed that i=1, j=6, V(1)=30, V(2)=21, $\Delta V(1)$=−9, and V(6)=−6. The memory management circuit 502 can obtain the difference between V(1) and V(6) as −36. The memory management circuit 502 can adjust the proportional parameter according to the difference between V(1) and V(6) (e.g., −36) and $\Delta V(1)$ (e.g., −9). For example, the memory management circuit 502 can divide the difference between V(1) and V(6) by $\Delta V(1)$ to obtain the adjustment value of the proportional parameter. For example, the adjustment value can be $\Delta F(i)$ in equation (1.4) or other parameters that can be used to adjust the proportional parameter. Taking $\Delta F(i)$ as an example, the memory management circuit 502 can divide the difference between V(1) and V(6) by $\Delta V(1)$ to determine $\Delta F(i)$ as 4 (−36/−9=4). The memory management circuit 502 can increase the proportional parameter (e.g., F(i) in equation (1.4)) according to $\Delta F(i)$. Later, this increased proportional parameter can be used to accelerate the adjustment of the read voltage.

Alternatively, in another exemplary embodiment of FIG. 9, it is assumed that i=1, j=5, V(1)=30, V(2)=−19, $\Delta V(1)$=−49, and V(5)=−6. The memory management circuit 502 can divide the difference between V(1) and V(5) (e.g., −36) by $\Delta V(1)$ to determine $\Delta F(i)$ as 0.73 (−36/−49=0.73). The memory management circuit 502 can decrease the proportional parameter (e.g., F(i) in equation (1.4)) according to $\Delta F(i)$. Later, this decreased proportional parameter can be used to improve the adjustment precision of the read voltage.

It should be noted that the equations (1.1) to (1.6) mentioned in the foregoing exemplary embodiment can be adjusted (e.g., by adding new parameters and/or changing the logic operation rules) according to practical requirements, and the invention is not limited thereto.

In an exemplary embodiment, each of the voltage levels V(1) to V(n) in FIG. 9 can correspond to one read voltage and can be used to read data from the first memory cells. The error checking and correcting circuit 508 in FIG. 5 can decode the data read from the first memory cells by using the voltage level V(i). If the decoding is successful, the error checking and correcting circuit 508 can output the successfully decoded data and end the decoding process. If the decoding fails, the voltage level V(i+1) can be used to reread the data from the first memory cells The error checking and correcting circuit 508 can decode the data read from the first memory cells by using the voltage level V(i+1). The voltage levels V(1) to V(n) can be used one by one to read the data from the first memory cells until the read data is successfully decoded or the number of times the decoding performed exceeds a preset number of times. For example, the preset number of times may be n times. In an exemplary embodiment, if the number of times the decoding performed exceeds the preset number of times (e.g., all the voltage levels V(1) to V(n) have been used) and yet the read data cannot be successfully decoded, a preset operation can be performed. For example, the preset operation may include the read voltage again by a more advanced decoding process and/or other methods. In an exemplary embodiment, the voltage levels V(1) to V(n) in FIG. 9 can also be adjusted during any read voltage adjustment or correction operation.

Figure 12:
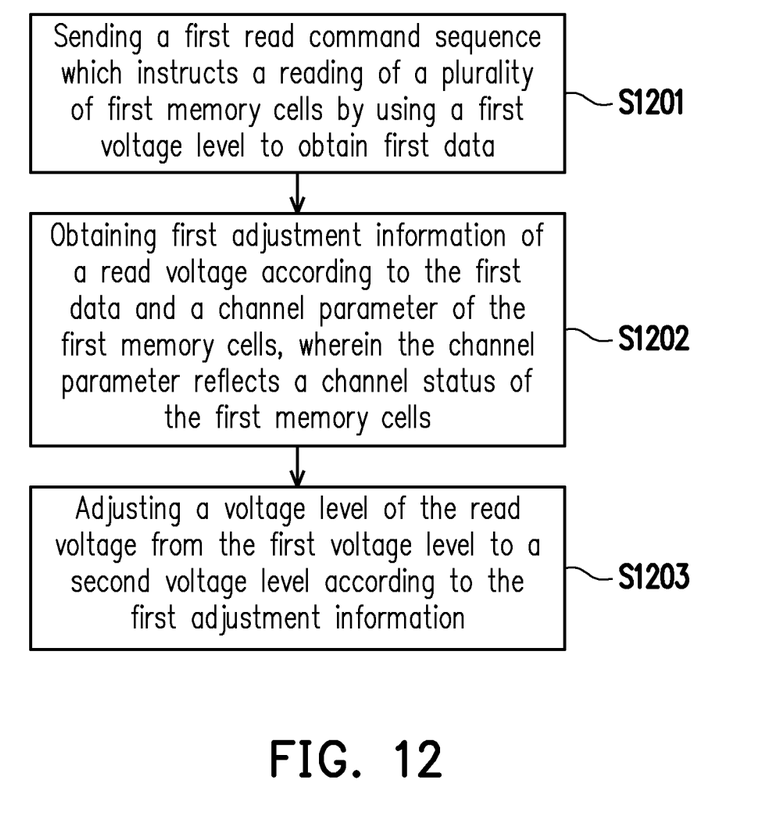
FIG. 12 is a flowchart illustrating a read voltage control method according to an exemplary embodiment of the invention.

FIG. 12 is a flowchart illustrating a read voltage control method according to an exemplary embodiment of the invention. Referring to FIG. 12, in step S1201, a first read command sequence which instructs a reading of a plurality of first memory cells by using a first voltage level to obtain first data is sent. In step S1202, first adjustment information of a read voltage is obtained according to the first data and a channel parameter of the first memory cells, wherein the channel parameter reflects a channel status of the first memory cells. In step S1203, a voltage level of the read voltage is adjusted from the first voltage level to a second voltage level according to the first adjustment information.

Figure 13:
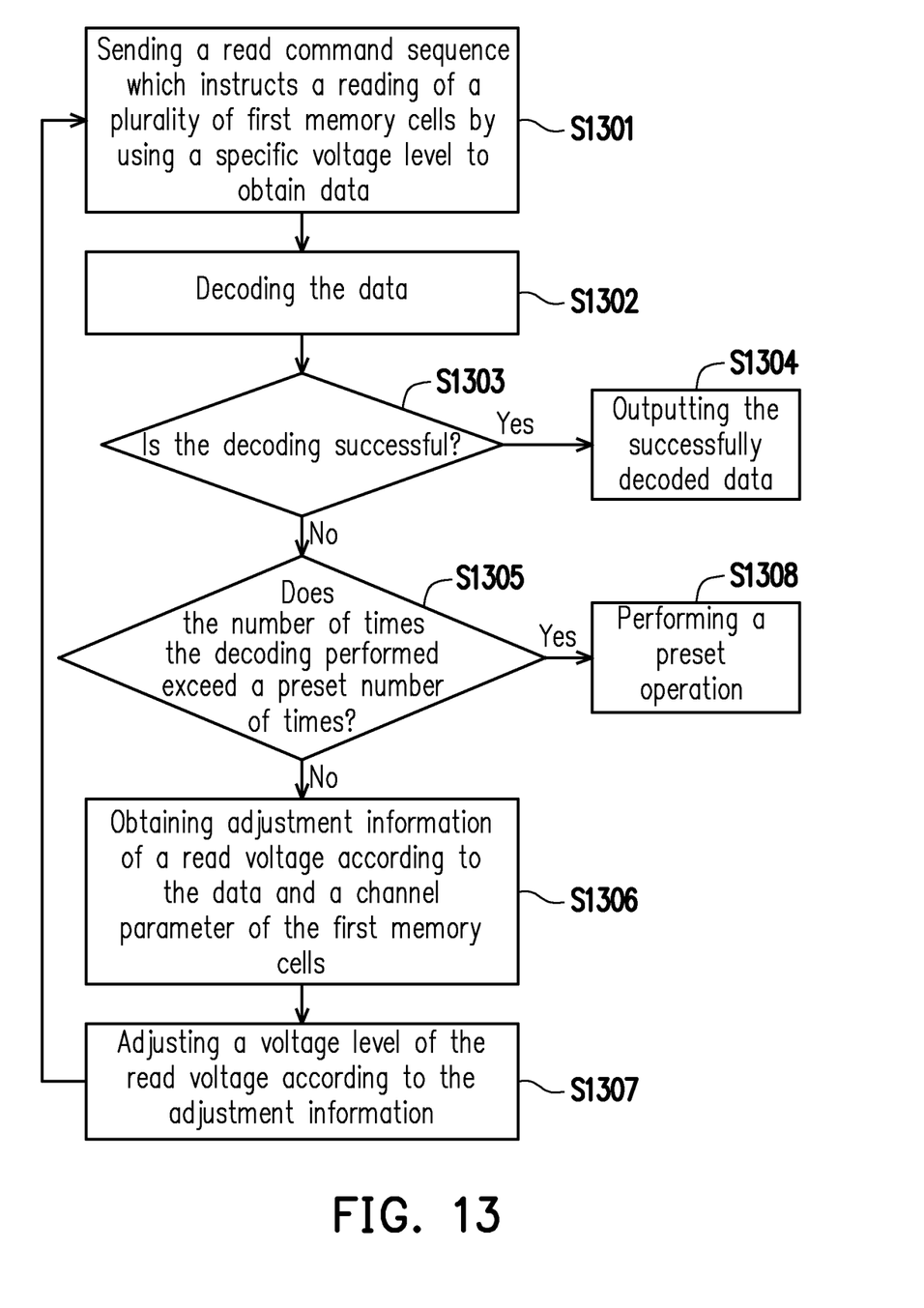
FIG. 13 is a flowchart illustrating a read voltage control method according to an exemplary embodiment of the invention.

FIG. 13 is a flowchart illustrating a read voltage control method according to an exemplary embodiment of the invention. Referring to FIG. 13, in step S1301, a read command sequence which instructs a reading of a plurality of first memory cells by using a specific voltage level to obtain to-be-decoded data is sent. In step S1302, the data is decoded. In step S1303, whether the decoding is successful is determined. If the decoding is successful, in step S1304, the successfully decoded data is outputted. If the decoding is not successful, in step S1305, whether the number of times the decoding performed exceeds a preset number of times is determined. If the number of times the decoding performed does not exceed the preset number of times, in step S1306, adjustment information of a read voltage is adjusted according to the data and a channel parameter of the first memory cells. In step S1307, a voltage level of the read voltage is adjusted according to the adjustment information. After step S1307, the read voltage adjusted in step S1301 can be used to read the data from the first memory cells again and execute the subsequent steps If it is determined in step S1305 that the number of times the decoding performed exceeds the preset number of times, in step S1308, a preset operation (e.g., a more advanced decoding process and/or other methods) is performed to correct the read voltage again.

Nevertheless, each of steps depicted in FIG. 12 and FIG. 13 have been described in detail as above, thus related description thereof is not repeated hereinafter. It should be noted that, the steps depicted in FIG. 12 and FIG. 13 may be implemented as a plurality of program codes or circuits, which are not particularly limited in the invention. Moreover, the methods disclosed in FIG. 12 and FIG. 13 may be implemented with reference to above embodiments, or may be implemented separately, which are not particularly limited in the disclosure.

In summary, after using one specific voltage level to read the first memory cell to obtain an approximate number of memory cells that can be turned on by this specific voltage level, the voltage level of the read voltage can be corrected and adjusted according to the approximate number and the channel status of the memory cells. In this way, the correction efficiency of the read voltage can be effectively improved.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A read voltage control method for a rewritable non-volatile memory module, wherein the rewritable non-volatile memory module comprises a plurality of memory cells, and the read voltage control method comprises:
    sending a first read command sequence which instructs a reading of a plurality of first memory cells in the memory cells by using a first voltage level to obtain first data, wherein the first data is a total number of memory cells turned on by the first voltage level in the first memory cells;
    determining a channel parameter according to curve information of a threshold voltage distribution of the first memory cells, wherein the curve information describes at least one of a curve endpoint, a curve type, a curve peak value and a curve slope of the threshold voltage distribution, and the threshold voltage distribution presents a number of memory cells each having a specific threshold voltage among the first memory cells;
    obtaining first adjustment information of a read voltage according to the first data and the channel parameter of the first memory cells, wherein the channel parameter reflects a channel status of the first memory cells; and
    adjusting a voltage level of the read voltage from the first voltage level to a second voltage level according to the first adjustment information.

2. The read voltage control method of claim 1, further comprising:
    if the channel status of the first memory cells matches a first status, determining the channel status as a first parameter; and
    if the channel status of the first memory cells matches a second status, determining the channel status as a second parameter,
    wherein the first parameter is different from the second parameter.

3. The read voltage control method of claim 1, wherein the channel status of the first memory cells comprises a threshold voltage distribution status of the first memory cells.

4. The read voltage control method of claim 1, further comprising:
    adjusting the first adjustment information of the read voltage according to a proportional parameter;

sending a second read command sequence which instructs a reading of the first memory cells by using the second voltage level to obtain second data; and adjusting the proportional parameter according to the first data and the second data.

5. The read voltage control method of claim 1, further comprising:

adjusting the first adjustment information of the read voltage according to a proportional parameter;

after adjusting the voltage level of the read voltage to the second voltage level, adjusting the voltage level of the read voltage to a third voltage level; and adjusting the proportional parameter according to the first adjustment information, the first voltage level and the third voltage level.

6. The read voltage control method of claim 5, wherein the step of adjusting the proportional parameter according to the first adjustment information, the first voltage level and the third voltage level comprises:

adjusting the proportional parameter according to a difference between the first voltage level and the third voltage level and the first adjustment information.

7. A memory storage device, comprising:

a connection interface unit configured to couple to a host system;

a rewritable non-volatile memory module comprising a plurality of memory cells; and a memory control circuit unit, coupled to the connection interface unit and the rewritable non-volatile memory module, wherein the memory control circuit unit is configured to send a first read command sequence which instructs a reading of a plurality of first memory cells in the memory cells by using a first voltage level to obtain first data, wherein the first data is a total number of memory cells turned on by the first voltage level in the first memory cells, the memory control circuit unit is further configured to determine a channel parameter according to curve information of a threshold voltage distribution of the first memory cells, wherein the curve information describes at least one of a curve endpoint, a curve type, a curve peak value and a curve slope of the threshold voltage distribution, and the threshold voltage distribution presents a number of memory cells each having a specific threshold voltage among the first memory cells;

the memory control circuit unit is further configured to obtain first adjustment information of a read voltage according to the first data and the channel parameter of the first memory cells, the channel parameter reflects a channel status of the first memory cells, and the memory control circuit unit is further configured to adjust a voltage level of the read voltage from the first voltage level to a second voltage level according to the first adjustment information.

8. The memory storage device of claim 7, wherein if the channel status of the first memory cells matches a first status, the memory control circuit unit is further configured to determine the channel status as a first parameter, and if the channel status of the first memory cells matches a second status, the memory control circuit unit is further configured to determine the channel status as a second parameter, wherein the first parameter is different from the second parameter.

9. The memory storage device of claim 7, wherein the channel status of the first memory cells comprises a threshold voltage distribution status of the first memory cells.

10. The memory storage device of claim 7, wherein the memory control circuit unit is further configured to adjust the first adjustment information of the read voltage according to a proportional parameter, the memory control circuit unit is further configured to send a second read command sequence which instructs a reading of the first memory cells by using the second voltage level to obtain second data, and the memory control circuit unit is further configured to adjust the proportional parameter according to the first data and the second data.

11. The memory storage device of claim 7, wherein the memory control circuit unit is further configured to adjust the first adjustment information of the read voltage according to a proportional parameter, after adjusting the voltage level of the read voltage to the second voltage level, the memory control circuit unit is further configured to adjust the voltage level of the read voltage to a third voltage level, and the memory control circuit unit is further configured to adjust the proportional parameter according to the first adjustment information, the first voltage level and the third voltage level.

12. The memory storage device of claim 11, wherein the operation of adjusting the proportional parameter according to the first adjustment information, the first voltage level and the third voltage level comprises:

adjusting the proportional parameter according to a difference between the first voltage level and the third voltage level and the first adjustment information.

13. A memory control circuit unit for controlling a rewritable non-volatile memory module, the memory control circuit unit comprising:

a host interface, configured to couple to a host system, a memory interface, configured to couple to a rewritable non-volatile memory module, wherein the rewritable non-volatile memory module comprises a plurality of memory cells; and a memory management circuit, coupled to the host interface and the memory interface, wherein the memory management circuit is configured to send a first read command sequence which instructs a reading of a plurality of first memory cells in the memory cells by using a first voltage level to obtain first data, wherein the first data is a total number of memory cells turned on by the first voltage level in the first memory cells, the memory management circuit is further configured to determine a channel parameter according to curve information of a threshold voltage distribution of the first memory cells, wherein the curve information describes at least one of a curve endpoint, a curve type, a curve peak value and a curve slope of the threshold voltage distribution, and the threshold voltage distribution presents a number of memory cells each having a specific threshold voltage among the first memory cells;

the memory management circuit is further configured to obtain first adjustment information of a read voltage according to the first data and the channel parameter of the first memory cells, the channel parameter reflects a channel status of the first memory cells, and the memory management circuit is further configured to adjust a voltage level of the read voltage from the first voltage level to a second voltage level according to the first adjustment information.

14. The memory control circuit unit of claim 13, wherein if the channel status of the first memory cells matches a first status, the memory management circuit is further configured to determine the channel status as a first parameter, and if the channel status of the first memory cells matches a second status, the memory management circuit is further configured to determine the channel status as a second parameter, wherein the first parameter is different from the second parameter.

15. The memory control circuit unit of claim 13, wherein the channel status of the first memory cells comprises a threshold voltage distribution status of the first memory cells.

16. The memory control circuit unit of claim 13, wherein the memory management circuit is further configured to adjust the first adjustment information of the read voltage according to a proportional parameter, the memory management circuit is further configured to send a second read command sequence which instructs a reading of the first memory cells by using the second voltage level to obtain second data, and the memory management circuit is further configured to adjust the proportional parameter according to the first data and the second data.

17. The memory control circuit unit of claim 13, wherein the memory management circuit is further configured to adjust the first adjustment information of the read voltage according to a proportional parameter, after adjusting the voltage level of the read voltage to the second voltage level, the memory management circuit is further configured to adjust the voltage level of the read voltage to a third voltage level, and the memory management circuit is further configured to adjust the proportional parameter according to the first adjustment information, the first voltage level and the third voltage level.

18. The memory control circuit unit of claim 17, wherein the operation of adjusting the proportional parameter according to the first adjustment information, the first voltage level and the third voltage level comprises:

adjusting the proportional parameter according to a difference between the first voltage level and the third voltage level and the first adjustment information.

* * * * *